United States Patent
Ogihara

(10) Patent No.: US 8,664,086 B2
(45) Date of Patent: Mar. 4, 2014

(54) SEMICONDUCTOR WAFER, SEMICONDUCTOR THIN FILM, AND METHOD FOR MANUFACTURING SEMICONDUCTOR THIN FILM DEVICES

(75) Inventor: Mitsuhiko Ogihara, Gunma (JP)

(73) Assignee: Oki Data Corporation, Tokyo (JP)

( * ) Notice: Subject to any disclaimer, the term of this patent is extended or adjusted under 35 U.S.C. 154(b) by 450 days.

(21) Appl. No.: 12/662,646

(22) Filed: Apr. 27, 2010

(65) Prior Publication Data

US 2010/0270562 A1    Oct. 28, 2010

(30) Foreign Application Priority Data

Apr. 28, 2009 (JP) ................................. 2009-109282

(51) Int. Cl.
*H01L 21/30* (2006.01)

(52) U.S. Cl.
USPC ................ 438/459; 438/39; 438/46; 438/47; 438/753; 257/77; 257/94; 257/103

(58) Field of Classification Search
USPC ............ 438/459, 39, 46, 47, 753; 257/77, 94, 257/103

See application file for complete search history.

(56) References Cited

U.S. PATENT DOCUMENTS 7,282,381 B2 * 10/2007 Feltin et al. ..................... 438/46
7,972,875 B2 * 7/2011 Rogers et al. .................... 438/21
8,093,082 B2 * 1/2012 Huang et al. ..................... 438/46
8,481,342 B2 * 7/2013 Ogihara et al. .................. 438/13
2008/0258165 A1 * 10/2008 Zimmerman et al. .......... 257/98

FOREIGN PATENT DOCUMENTS

| JP | 11-297628 A | 10/1999 |
| JP | 2005079369 A | 3/2005 |
| JP | 2005-129876 A | 5/2005 |
| JP | 2006-120785 A | 5/2006 |
| JP | 2006-179802 A | 7/2006 |
| JP | 2007-201336 A | 8/2007 |

OTHER PUBLICATIONS

Lee et al., "A printable form of single-crystalline gallium nitride for flexible optoelectronic systems", Small (2005) pp. 1164-1168.*

* cited by examiner

*Primary Examiner* — Jay C Kim
(74) *Attorney, Agent, or Firm* — Rabin & Berdo, P.C.

(57) ABSTRACT

A method for manufacturing a semiconductor thin film device includes: forming a buffer layer on an Si (111) substrate and a single crystal semiconductor layer on the buffer layer; forming an island including the semiconductor layer, buffer layer, and a portion of the substrate; forming a coating layer on the island; etching the substrate along its Si (111) plane to release the island from the substrate, the coating layer serving as a mask; and bonding the released island to another substrate, a released surface of the released island contacting the another substrate. A semiconductor device includes a single crystal semiconductor layer other than Si, which has a semiconductor device formed on a front surface of an Si (111) layer lying in a (111) plane. The layer is bonded to another substrate with a back surface contacting the another substrate or a bonding layer formed on the another substrate.

9 Claims, 10 Drawing Sheets

- 506 p-GaN
- 505 p-Al$_t$Ga$_{1-t}$N (1≧t≧0)
- 504 Ga$_y$In$_{1-y}$N/Ga$_x$In$_{1-x}$N MQW(1≧y>x≧0)
- 503 n-Al$_s$Ga$_{1-s}$N (1≧s≧0)
- 502 n-GaN 103 brackets 503–505.

- 506
- 505
- 504
- 502

- 605 p-GaN
- 604 p-Al$_y$Ga$_{1-y}$N (1≧y≧0)
- 603 Ga$_x$In$_{1-x}$N (1≧x≧0)
- 602 n-GaN

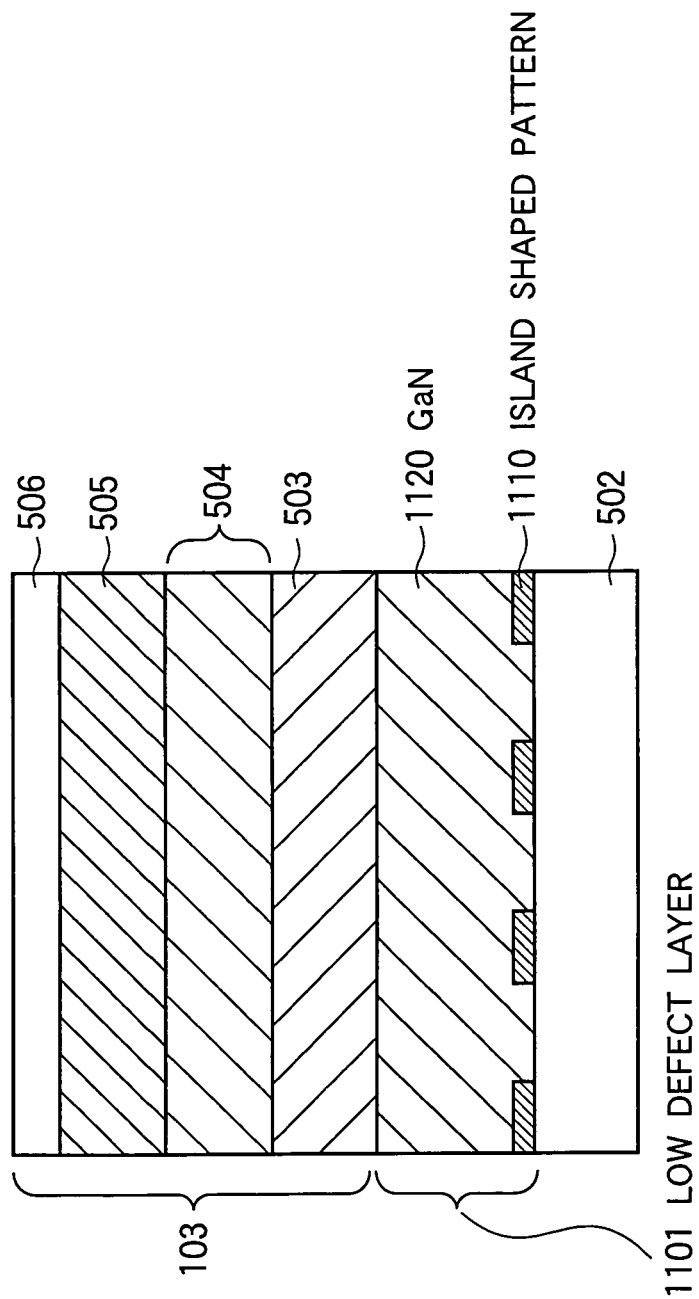

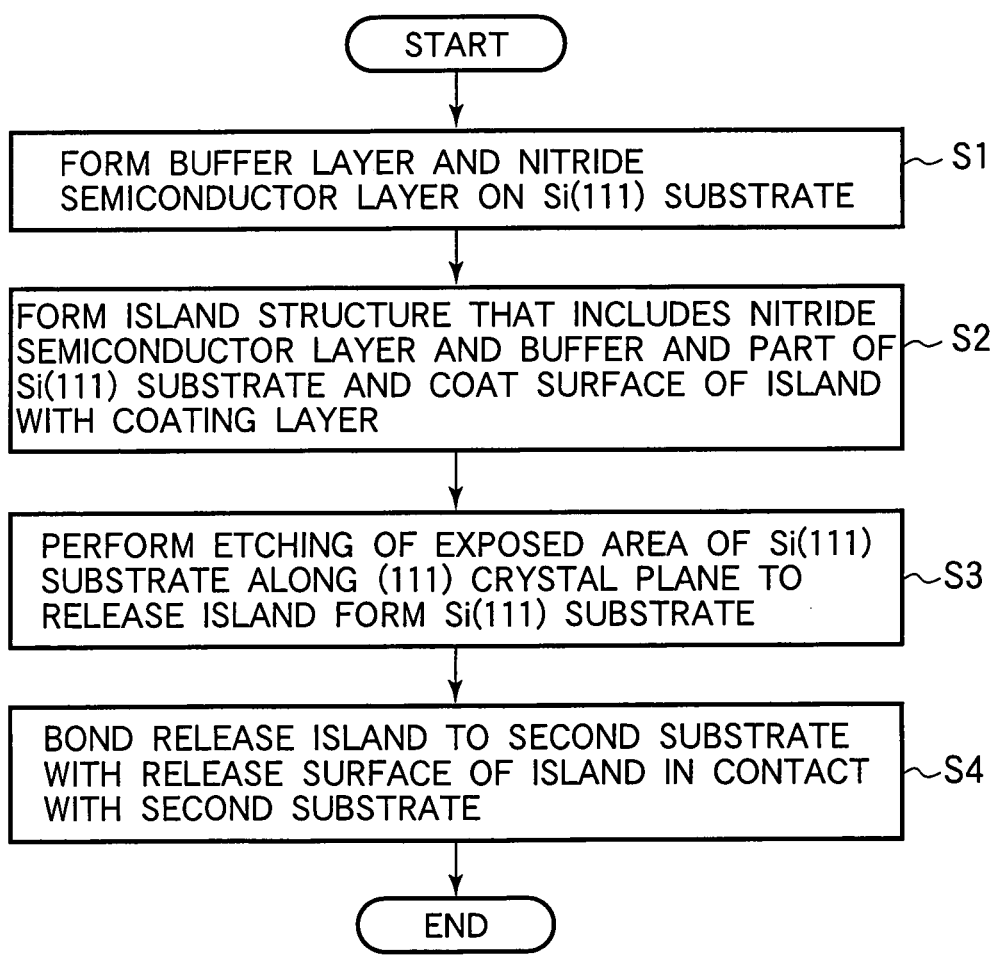

SEMICONDUCTOR WAFER, SEMICONDUCTOR THIN FILM, AND METHOD FOR MANUFACTURING SEMICONDUCTOR THIN FILM DEVICES

BACKGROUND OF THE INVENTION

1. Field of the Invention

The present invention relates to semiconductor wafers, semiconductor thin film devices, and a method of manufacturing semiconductor thin film devices.

2. Description of the Related Art

Nitride semiconductor devices and SiC semiconductor devices are known which are formed on an Si substrate for excellent heat dissipation and electrical characteristics. Japanese Patent Application Publication No. 2005-129876 discloses the following technology. A porous Si layer is formed on a first Si substrate (growth substrate) or, i.e., Si (100) substrate, a BP buffer layer is formed on the porous Si layer, then a GaN/AlGaN layer is formed on the BP buffer, and finally an Al/Ti layer is formed on the GaN/AlGaN layer. The structure is then bonded to a second Si substrate (support substrate) with the Al/Ti layer in direct contact with the second Si substrate. Then, the entire structure is divided at the porous Si layer from the first Si substrate. The publication also discloses a technology in which the BP layer and GaN layer are removed from the structure and then a Ti/Al/Pt electrode is formed on the uppermost layer.

After transferring the structure formed on the first Si substrate onto the second Si substrate, the first Si substrate is removed and the buffer layer is removed by lapping before forming an electrode thereon. This implies that the order in which the respective layers are formed on the second Si substrate is reversed with respect to that when the layers are formed on the first Si substrate.

However, this process presents a problem in that some components are difficult to isolate. In addition, a device formed on a growth substrate may not be transferred onto another substrate without difficulty. When components are to be formed after a semiconductor layer has been bonded to another substrate, if the component isolation process includes a high temperature heating process, an Al/Ti layer, for example, may not be reliably bonded. Highly doped nitride semiconductor and SiC are still difficult to achieve high activation by their nature, resulting in difficulty in forming low-resistance contacts between these semiconductor materials and metal electrodes.

SUMMARY OF THE INVENTION

The present invention was made in view of the aforementioned drawbacks.

An object of the invention is to provide a method for manufacturing semiconductor thin film devices having a single crystal semiconductor layer other than Si on an Si crystal layer.

Another object of the invention is to provide a semiconductor wafer and semiconductor thin film devices.

A method for manufacturing a semiconductor thin film device includes the following steps:

forming a buffer layer on a surface of a first substrate in the form of an Si substrate and a single crystal semiconductor layer on the buffer layer;

forming an island that includes the single crystal semiconductor layer, the buffer layer, and a portion of the Si (111) substrate;

forming a coating layer on a surface of the island;

etching the Si (111) substrate along an Si (111) plane of the Si (111) substrate to release the island from the Si (111) substrate, the coating layer serving as a mask during etching; and bonding the released island to a second substrate with a released surface of the released island in direct contact with the second substrate.

A semiconductor device includes a single crystal semiconductor layer other than Si formed on a front surface of principal surfaces of an Si (111) layer having opposed principal surfaces that lie in (111) planes. The single crystal semiconductor layer has a semiconductor device. The single crystal semiconductor layer is bonded to the Si (111) layer with a back surface of the principal surfaces facing a surface of a substrate or a surface of a bonding layer formed on the surface of the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 5 illustrate an exemplary configuration of a light emitting device;

FIG. 8 is a flowchart illustrating the major manufacturing steps according to the first embodiment;

DETAILED DESCRIPTION OF THE INVENTION

Figure 1A:
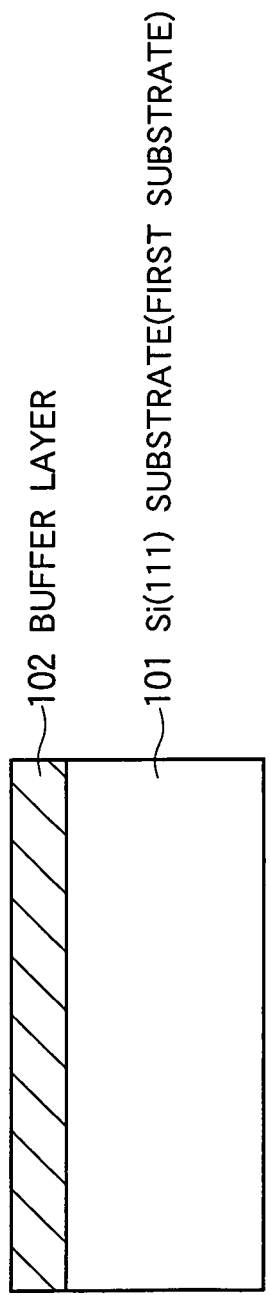
FIG. 1A illustrates a first substrate or an Si (111) substrate and a buffer layer formed on a surface of the Si (111) substrate.

Embodiments of the invention will be described with reference to the drawings. FIGS. 1-12 schematically illustrate the embodiments, and the shapes and dimensions of the respective portions do not limit the scope of the invention. Like elements have been given like reference numerals and their description may be omitted as required.

First Embodiment

FIGS. 1-8 illustrate a first embodiment. The first embodiment will be described with reference to FIGS. 1-8.

Figure 1B:
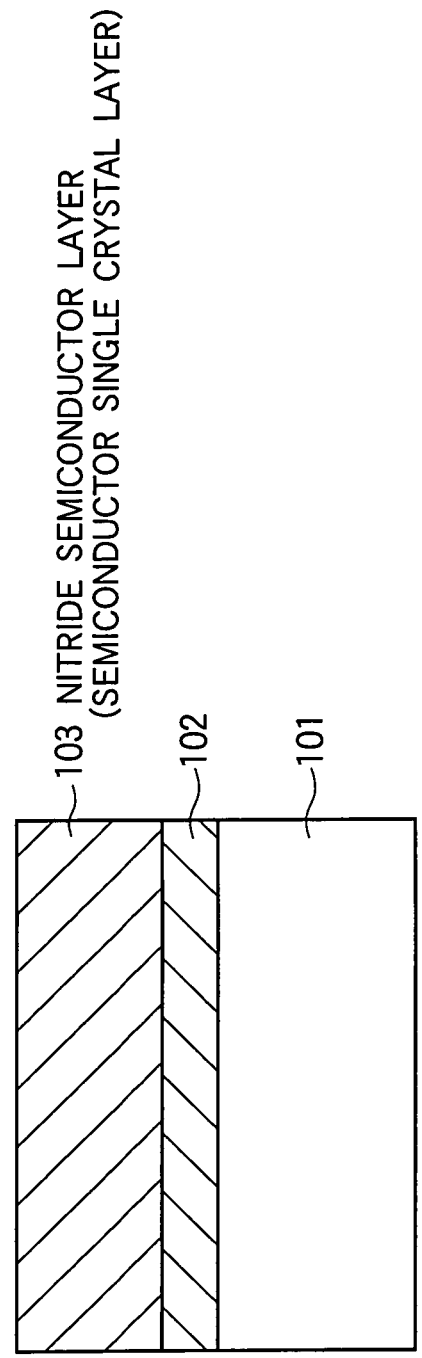
FIG. 1B illustrates a nitride semiconductor layer formed on the buffer layer shown in FIG. 1A.

FIG. 1A illustrates a first substrate or an Si (111) substrate 101 and a buffer layer 102 formed on a surface of the Si (111) substrate 101. FIG. 1B illustrates a nitride semiconductor layer 103 formed on the buffer layer 102 shown in FIG. 1A.

The term "Si (111) substrate" of the first embodiment refers to a substrate having a principal surface that lies substantially in a (111) crystal plane; it being understood that this surface may somewhat deviate from an ideal (111) crystal plane (referred to as "just plane" hereinafter).

Referring to FIG. 1A, a buffer layer 102 is formed on the Si (111) substrate 101. The nitride semiconductor layer 103 is then formed on the buffer layer 102. The buffer layer 102 is formed of a semiconductor material selected from the group consisting of $Al_xGa_{1-x}N$ ($0 \leq x \leq 1$), $In_xGa_{1-x}N$ ($0 \leq x \leq 1$), and $Al_xIn_{1-x}N$ ($0 \leq x \leq 1$).

When an island structure 150, which will be described later, is bonded to a bonding layer 210 formed on the surface of a second substrate 201, if a release surface "A" of the island structure 150 is to be in ohmic contact with the surface of the bonding layer 210, the Si (111) substrate 101 (first substrate) is preferably a low-resistance substrate. The buffer layer 102 is preferably heavily doped with an impurity, and moreover it is preferable that the buffer layer 102 and the Si (111) substrate 101 are of the same conductivity type.

In this specification, the term "low-resistance substrate" refers to a substrate having a volume resistivity equal to or lower than 0.01 Ω·cm. If the buffer layer 102 is heavily doped, it has an impurity concentration or a carrier concentration equal to or higher than $1 \times 10^{18}$ cm$^{-3}$.

As shown in FIG. 1B, a nitride semiconductor layer 103 is a single crystal semiconductor layer and is formed on the surface of the buffer layer 102. The nitride semiconductor layer 103 is a single crystal semiconductor layer used to form, for example, nitride light-emitting devices or nitride electronic devices. Specific structures of the nitride semiconductor layer 103 for implementing a variety of devices will be described with reference to FIGS. 2-5.

Figure 2A:
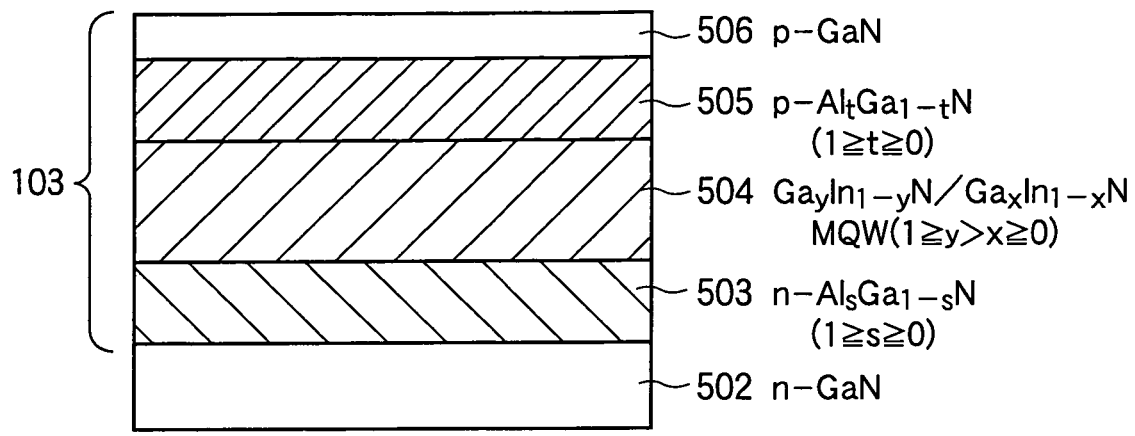
FIGS. 2A-2C illustrate an example of a light emitting device.
Figure 2B:
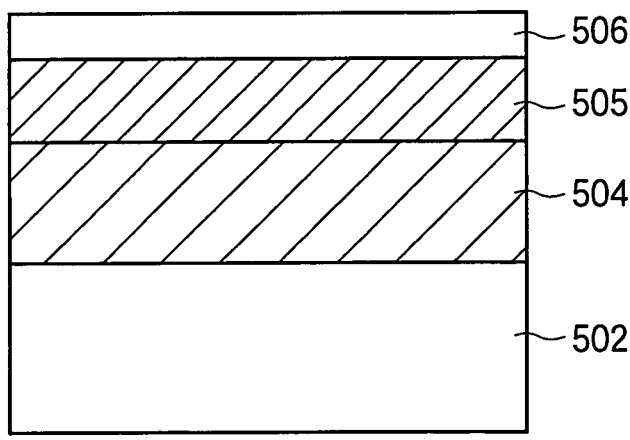
Figure 2C:
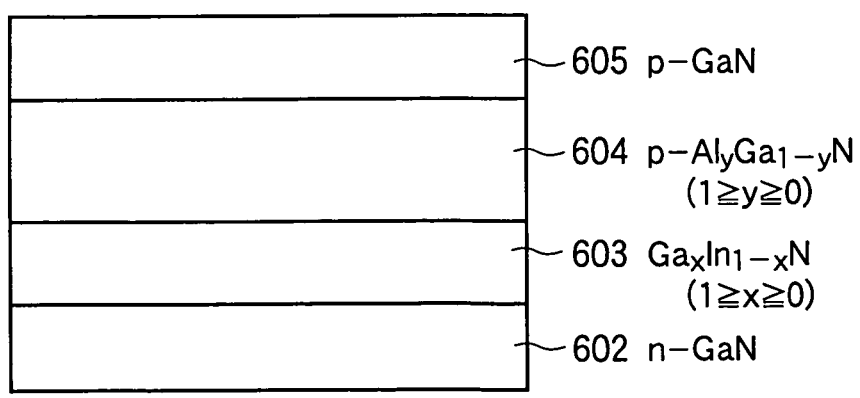
Figure 3A:
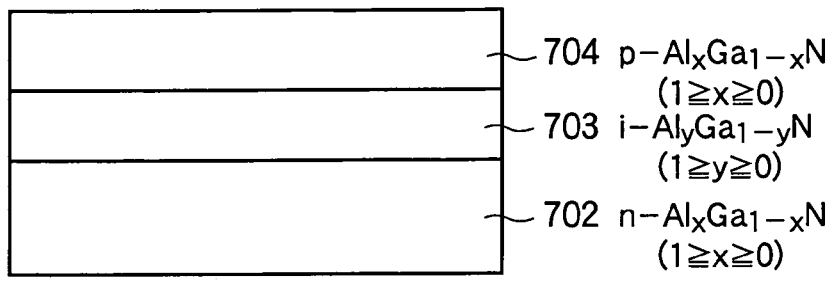
FIGS. 3A-3B illustrate an example of a light receiving device.
Figure 3B:
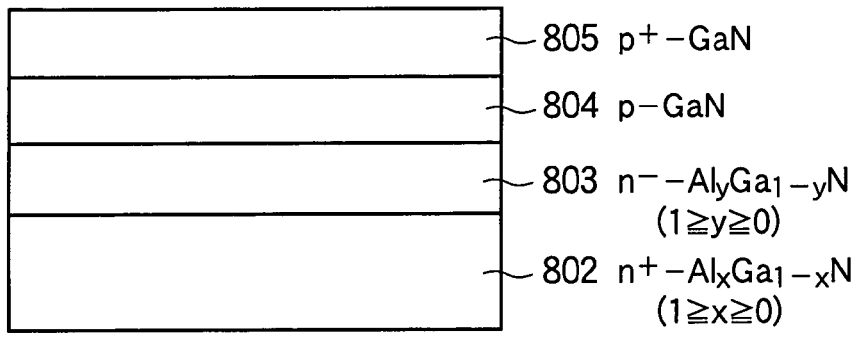
Figure 4A:
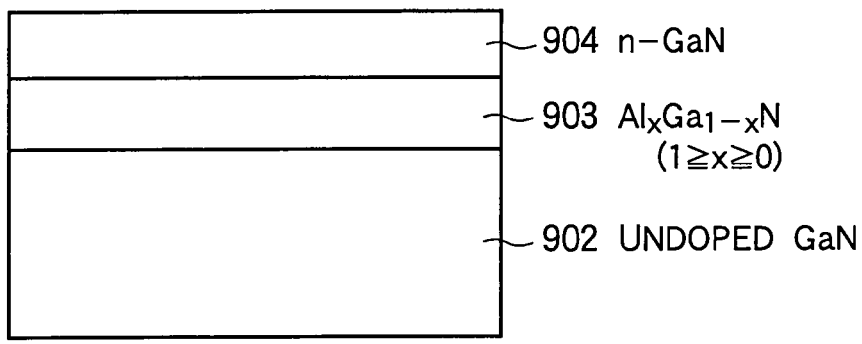
FIGS. 4A-4B illustrate an example of an electronic device.
Figure 4B:
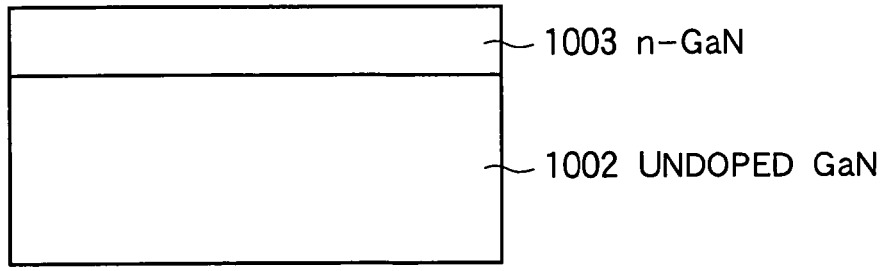

FIGS. 2A-2C illustrate an example of a light emitting device. FIGS. 3A-3B illustrate an example of a light receiving device. FIGS. 4A-4B illustrate an example of an electronic device. FIG. 5 illustrate an exemplary configuration of a light emitting device in which crystal defects extend from an interface between a substrate and a semiconductor crystal growth layer into a device operation layer.

The light emitting device illustrated in FIGS. 2A-2C includes, for example, a first conductivity type GaN layer 502, a first conductivity type $Al_sGa_{1-s}N$ ($1 \geq s \geq 0$) layer 503, a multiple quantum well 504, a second conductivity type $Al_tGa_{1-t}N$ ($1 \geq t \geq 0$) layer 505, and a second conductivity type GaN layer 506. The multiple quantum well 504 is, for example, $Ga_yIn_{1-y}N/Ga_zIn_{1-z}N/ \ldots /Ga_xIn_{1-x}N/Ga_yIn_{1-y}N/Ga_zIn_{1-x}N$ ($1 \geq y > x \geq 0$) The first conductivity type is the same as the conductivity type of the buffer layer 102. For example, the first conductivity type is an n-type and the second conductivity type is a p-type. As shown in FIG. 2B, the first conductivity type $Al_sGa_{1-s}N$ ($1 \geq s \geq 0$) layer 503 may be omitted. Referring to FIG. 2C, the light emitting device includes a first conductivity type GaN layer 602, a $Ga_xIn_{1-x}N$ ($1 \geq x \geq 0$) layer 603, a second conductivity type $Al_yGa_{1-y}N$ ($1 \geq y \geq 0$) layer 604, and a second conductivity type GaN layer 605.

FIG. 3A illustrates an example of a PIN photodiode which includes a first conductivity type $Al_xGa_{1-x}N$ ($1 \geq x \geq 0$) layer 702, an i-type $Al_yGa_{1-y}N$ ($1 \geq y \geq 0$) layer 703, and a second conductivity type $Al_xGa_{1-x}N$ ($1 \geq x \geq 0$) layer 704. FIG. 3B illustrates an example of a phototransistor which includes an n$^+$type $Al_xGa_{1-x}N$ ($1 \geq x \geq 0$) layer 802, an n$^-$type $Al_yGa_{1-y}N$ ($1 \geq y \geq 0$) layer 803, a P type GaN layer 804, and a P$^+$type GaN layer 805.

FIG. 4A illustrates an example of a high electron mobility transistor (HEMT) which includes an undoped GaN layer 902, an $Al_xGa_{1-x}N$ ($1 \geq x \geq 0$) layer 903 and an n-type GaN layer 904. FIG. 4B illustrates an example of a metal semiconductor field effect transistor (MESFET) which includes an undoped GaN layer 1002 and a first conductivity GaN layer 1003.

Referring to FIG. 5, a low defect layer 1101 includes an island-shaped pattern 1110 formed of $SiO_2$ or SiN and a GaN layer 1120. The low defect layer 1101 is sandwiched between the nitride semiconductor layer 103 of a light emitting device (FIGS. 2A-2B) and the first conductivity type GaN layer 502, thereby preventing defects due to threading dislocation extending through the semiconductor layer that lies over the island shaped pattern 1110. A GaN layer 1120 is grown over the island pattern 1110 by lateral epitaxy, thereby allowing threading dislocation to propagate laterally than the thickness-wise so that the dislocation tends to be difficult to thread into the upper crystal layers. In this manner, the low defect layer 1101 provides an advantage of minimizing defects.

Figure 6A:
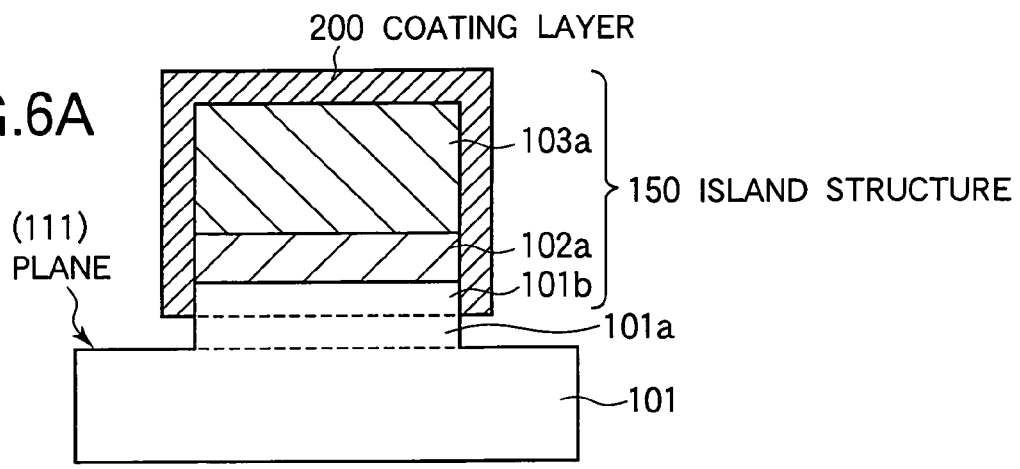
FIG. 6A illustrates a process for coating island structures (only one of which is shown)

FIG. 6A illustrates a process for coating the island structures 150 (only one of which is shown in the drawing). A mask is formed to cover the side surface of the portion 101a and the surface of the Si (111) substrate 101. Then, a coating layer 200 is formed to cover the island structure 150. The mask is then removed so that the side surface of the portion 101a and the surface of the Si (111) substrate 101 are exposed as shown in FIG. 6A.

Figure 6B:
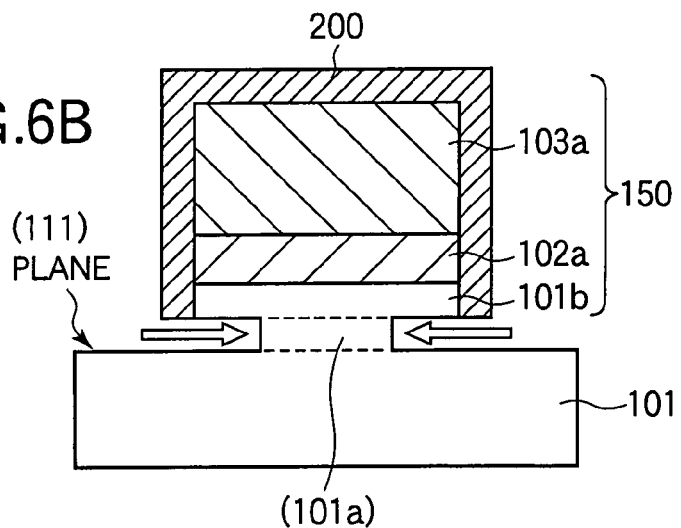
FIGS. 6B-6C illustrates a process for etching the Si (111) substrate 101 and releasing the island structures from the Si (111) substrate.
Figure 6C:
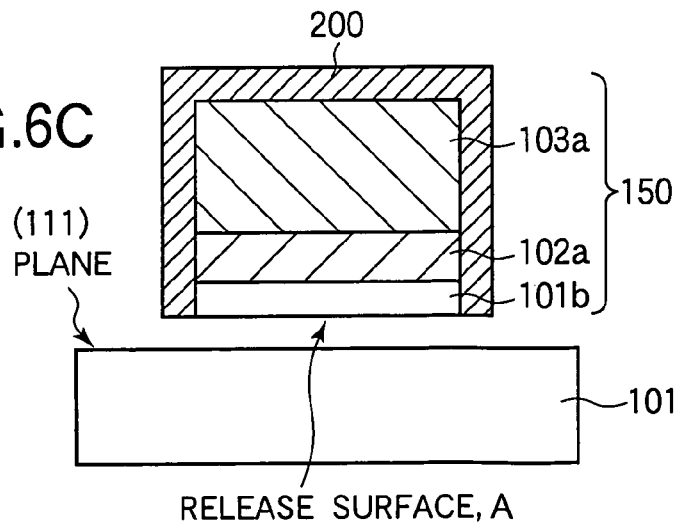

FIGS. 6B-6C illustrates a process for etching the Si (111) substrate 101 and releasing the island structures 150 from the Si (111) substrate 101.

A description will be given of the processes for coating the island structures 150, etching the Si (111) substrate 101, and releasing the island structures 150 from the Si (111) substrate 101 with reference to FIG. 6A-6C. The island structure 150 includes a buffer layer 102a, a nitride semiconductor layer 103a, and a portion 101b of the Si (111) substrate 101, and is formed on the surface of the Si (111) substrate 101. The portion 101b has a predetermined thickness. Then, the island structure 150 is coated with the coating layer 200. The exposed portion of the Si (111) substrate 101 (surface not coated with the coating layer 200) is etched away in a direction parallel to the Si (111) plane, so that the island structure 150 is released from the Si (111) substrate 101.

Referring to FIG. 6A, the structure shown in FIG. 1B is etched to form the island structure 150, which includes the nitride semiconductor layer 103a, the buffer layer 102a, and the portions 101a and 101b of the Si substrate 101. The island structure 150 may be formed by dry-etching.

Referring to FIGS. 6B and 6C, etching is performed to etch away the portion 101a of the Si (111) substrate, i.e., a bottom portion of the island structure 150 to expose a released surface. The etching performance or etching rate of the Si (111) substrate 101 depends on the plane direction of the Si (111) substrate 101. The principal surface of the Si (111) substrate 101 may deviate slightly from the (111) "just plane." The island structure 150 is preferably coated with the coating layer 200 prior to etching. The Si (111) substrate 101 is placed in an anisotropic etchant so that the Si (111) substrate 101 is etched preferentially in a direction parallel to the (111) plane.

Prior to the etching process, a first support (not shown) may be employed which supports the island structure 150, and a second support (not shown) may be employed which couples the respective island structures 150 together.

The anisotropic etchant is conveniently used for etching the Si (111) substrate 101. An anisotropic etchant will react very slowly with the (111) plane in which the principal surface of the Si (111) substrate lies, and extremely fast in a direction parallel to the (111) plane (FIG. 6B, white arrows). The anisotropic etchant for the first embodiment may be selected from etchants that contain a chemical agent, for example, KOH or tetra-methyl-ammonium-hydroxide (TMAH). Alternatively, ethylene diamine pyrocatechol (EDP) may be used as an anisotropic etchant though not preferable.

The coating layer 200 may be in the form of an insulating film. The coating layer 200 is preferably sufficiently resistant to the anisotropic etchant. The coating layer 200 may be formed of one or more films selected from the group consisting of an SiN film, an $SiO_2$ film, an SiON film, an $Al_2O_3$ film, an AlN film, a PSG film, and a BSG film. These films may be formed on the island structure 150 by P-CVD, CVD, or sputtering. These films may also be formed by printing or coating, for example, spin-on-glass (SOG). The coating layer 200 may be a film of an inorganic material, a film of an organic material, or a combination of a film formed of an organic material and an inorganic material, in which case the surface of the organic material film may be coated with an inorganic insulating film so as to make the coating layer 200 resistant to the anisotropic etchant.

The inventors examined the surface roughness of the Si (111) substrate 101 at the release surface "A" shown in FIG. 6C under an atomic force microscope (AFM) after anisotropic etching to create the island structures 150, and confirmed that the roughness was excellent.

The flatness or peak-to-valley roughness $R_{PV}$ of the release surface "A" of the portion 101b over an area of 5 μm square was measured. The flatness was $R_{PV} \leq 0.5$ nm, which is a difference between a peak and a valley, for a short period peak and valley (e.g., 100 nm to several hundred nanometers). The flatness was $R_{PV} \leq 1.6$ nm, which is a difference between a peak and a valley, for a long period peak and valley (e.g., several millimeters). The bonding layers can be placed close to each other with the distance between the two surfaces on the order of nano meters.

Figure 7A:
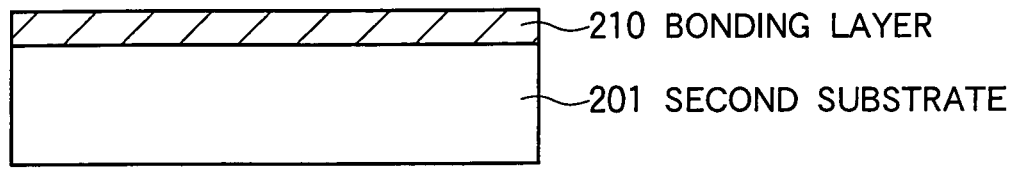
FIGS. 7A-7C illustrate a process in which the island structures (only one of which is shown) are bonded to a second substrate.
Figure 7B:
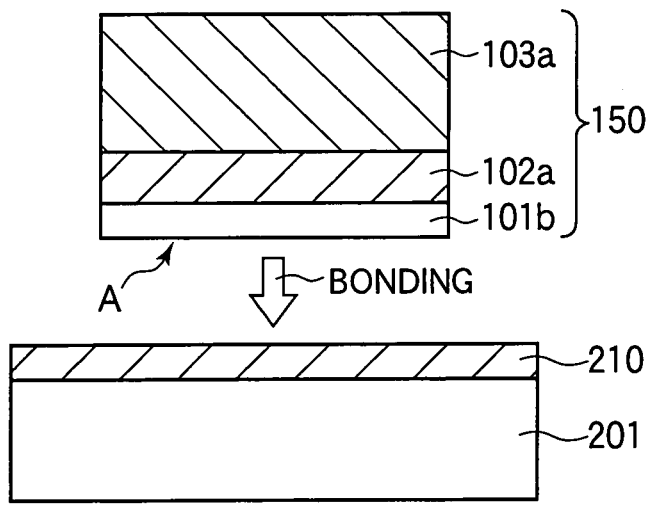
Figure 7C:
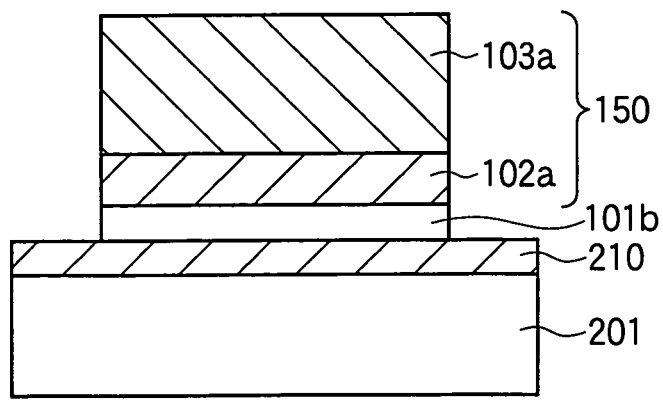

FIGS. 7A-7C illustrate the process in which the island structures 150 (only one of which is shown in the drawing) are bonded to a second substrate 201.

A description will be given of a process in which the island structure 150 is bonded to the second substrate 201 after having been released from the Si (111) substrate 101 with reference to FIGS. 7A-7C.

Referring to FIG. 7A, the second substrate 201 having the bonding layer 210 formed thereon is prepared. The bonding layer 210 is employed for implementing good bonding. The term "good bonding" in this specification refers to uniform bonding strength in a bonding region so that no void is formed in the bonding region and no crack occurs in the bonded surfaces.

The first embodiment provides a specific example of a low-resistance ohmic contact between the release surface "A" of the island structures 150 and the bonding layer 210. For an ohmic contact to be formed between the portion 101b and the bonding layer 210, the release surface "A" is preferably highly doped with an impurity so that the doped region is electrically active.

If the release surface "A" of the island structure 150 bonded to the second substrate via the bonding layer 210 is formed of a nitride semiconductor layer, for example, AlN layer, highly doping the nitride semiconductor with an n type impurity (e.g., Si) will not result in a high active rate of the dopant, so that an effective carrier concentration cannot be high and therefore a low-resistance ohmic contact cannot be obtained. Specifically, doping the n type AlN layer with Si to a doping level of $1 \times 10^{18}$ $cm^{-3}$ or higher may result in a carrier concentration only of, for example, $1 \times 10^{17}$ $cm^{-3}$, which is not sufficient.

As described previously, the island structure 150 includes the nitride semiconductor layer 103, the buffer layer 102, and the portion 101b of the Si (111) substrate 101. Since the portion 101b is a part of the Si (111) substrate 101, the portion 101b has the same volume resistivity as the Si (111) substrate 101. The portion 101b having a resistivity equal to or lower than 0.01 Ω·cm can be easily implemented by selecting the first substrate 101 having a volume resistivity equal to or lower than 0.01 Ω·cm. One aspect of the present invention is that the island structure 150 has the portion 101b which is a part of the Si (111) substrate 101 having a low volume resistivity, and is therefore effective in implementing a low-resistance ohmic contact.

If the bonding layer 210 takes the form of a metal layer, a single layer, a laminated layer, or an alloy may be used which contains a metal or metals selected from the group consisting of Ni, Ti, Cr, Pd, Al, and Cu. The bonding layer 210 may also be formed of a layer of a non-metal material. The non-metal materials include insulating film materials including SiN, SiON, $SiO_2$, $Al_2O_3$, and AlN; a layer of material, for example, a diamond like carbonized layer that contains "C"; a layer of oxide material including ITO and ZnO or a transparent conductive material; or a layer of organic material including polyimide and BCB or an organic conductive material.

The second substrate 201 takes the form of, for example, a compound semiconductor substrate, for example, an Si substrate, a GaAs substrate, a GaP substrate, and an InP substrate; a nitride semiconductor substrate, for example, a GaN substrate, an AlN substrate, an $Al_xGa_{1-x}N$ (1≥x≥0) substrate, an $In_xGa_{1-x}N$ (1≥x≥0) substrate, an $Al_xIn_{1-x}N$ (1≥x≥0) substrate (1≥x≥0); a glass substrate; a quartz substrate; a ceramic substrate formed of AlN or PBN; a sapphire substrate; an oxide substrate formed of $LiNb_3$, MgO, or $GaO_3$; a plastic substrate formed of PET or PEN; a metal substrate of, for example, stainless steel, nickel, copper, brass, or aluminum; a plated metal substrate, for example, a nickel-plated metal or a copper-plated metal; and a diamond-like-carbon substrate.

The bonding layer 210 may be omitted and the island structure 150 may be directly bonded to the second substrate 201, in which case a bonding agent is not used but the surfaces of the island structure 150 and the second substrate 201 are directly contacted and fixed relative to each other. For example, the surfaces of the island structure 150 and the second substrate 201 are positioned so that the distance between them is on the order of nano meters or within 10 nm, thereby utilizing intermolecular force acting between the opposing surfaces. The bonding between the island structure 150 and the second substrate 201 may be achieved by using other bonding techniques, for example, covalent bonding between the bonding surfaces, electrostatic coupling, bonding by atomic rearrangement such as an alloy, or bonding by an adhesive. Bonding agents for this purpose include a solder paste, an Ag paste, a thermosetting bonding agent, a UV curing adhesive, an adhesive, and organic coating materials including polyimide and BCB.

For reliable bonding by intermolecular force, the surfaces of the bonding layer 210 and the island structure 150 are subjected to cleaning and/or surface activation treatment before bonding the island structure 150 to the bonding layer 210 formed on the second substrate 201 (FIGS. 7B and 7C). A heating process may also be used for pressing the island structure 150 against the second substrate 201 depending on the properties of the materials to be bonded.

FIG. 8 is a flowchart illustrating the major manufacturing steps according to the first embodiment.

The major steps include forming a buffer layer and a nitride semiconductor layer on the surface of an Si (111) substrate (step Si); forming the island structure 150 that includes a nitride semiconductor layer, a buffer layer, and a part of the Si (111) substrate; and coating the surface of the island structure 150 with a coating layer (step S2); etching the Si (111) substrate at its exposed region in a direction parallel to the (111) plane of the Si (111) substrate to release the island structure 150 from the Si (111) substrate (step S3); and bonding the released island structure 150 to the surface of the second substrate (step S4).

The release surface "A" of the island structure 150 has a flatness of $R_{PV} \leq 0.5$ nm, which is extremely flat. This flatness allows the bonding surfaces to be very close to each other, e.g., the distance between the bonding surfaces is on the order of nano meters so that the intermolecular force acting between the bonding surfaces may be sufficiently large. The manufacturing process according to the first embodiment is effective in firmly bonding the surfaces together. That is, a firm bonding may be implemented by using intermolecular force that acts between the two bonding surfaces.

After the island structure 150 has been bonded to the surface of the second substrate 201, the support and/or coating layer is removed as required. The island structure 150 may have a predetermined device structure or a part of the device structure before being released from the Si (111) substrate 101. Alternatively, a device structure or device elements such as a wiring layer may be formed on the second substrate and then the island structure 150 may be electrically or optically connected to the devices and wiring layers on the second substrate after the island structure 150 has been bonded to the second substrate, thereby implementing an integrated circuit. Still alternatively, a plurality of island structures 150 may be bonded to the second substrate and interconnected to implement an integrated circuit.

The first embodiment includes the following steps:

forming a buffer layer and a nitride semiconductor layer on the surface of a first substrate or an Si (111) substrate;

forming an island structure containing a part of the Si (111) substrate under the buffer layer;

forming a coating layer that coats the surface of the island structure;

etching the bottom surface of the island structure using the coating layer as a mask to release the island structure from the Si (111) substrate; and bonding the released island structure to the surface of a second substrate by means of intermolecular force.

Performing the aforementioned steps provides the following advantages.

(1) A sacrificial layer for releasing the island structure is not required, thereby simplifying the manufacturing process.

(2) A release surface having a good flatness can be obtained, enabling intermolecular bonding.

(3) The release surface of the island structure to be bonded to another substrate can be highly doped. This implies that the island structure may be bonded to a metal layer with a low-resistance ohmic contact.

(4) An Si (111) substrate may be re-used.

Second Embodiment

FIGS. 9-10 illustrate a second embodiment. The second embodiment differs from the first embodiment in the material of a semiconductor layer formed on an Si (111) substrate 101. An island structure 150 is released from a first substrate or the Si (111) substrate 101 and is bonded to a second substrate 201 in the same way as in the first embodiment. Thus, the second embodiment will be described mainly with respect to portions different from the first embodiment.

Figure 9A:
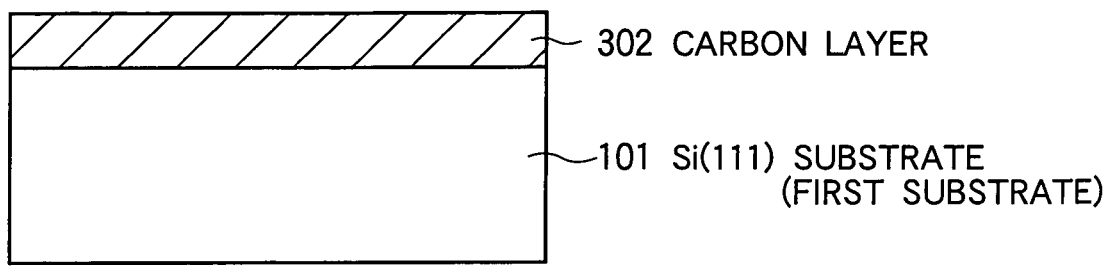
FIGS. 9A-9B illustrate the configuration of a substrate of a second embodiment.
Figure 9B:
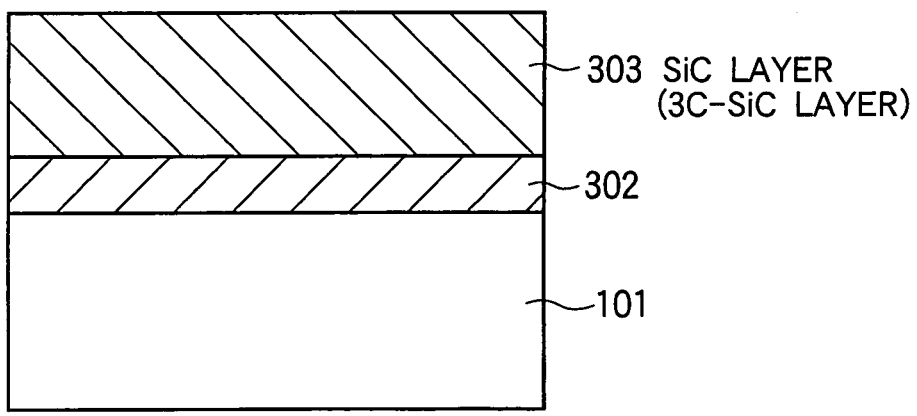

FIGS. 9A-9B illustrate the configuration of a substrate of the second embodiment.

The configuration of the substrate of the second embodiment will be described with reference to FIGS. 9A-9B. A carbonized layer 302 and a cubic crystal layer or a 3C—SiC layer 303 which is an SiC (silicon carbide) layer are formed one on top of the other on an Si (111) substrate 101. Referring to FIG. 9A, the carbonized layer 302 is formed on the Si (111) substrate 101. The carbonized layer 302 may be formed on the surface of the Si (111) substrate 101 by using carbon ion implantation. If ion implantation causes damage in the carbonized layer 302, the damaged portion may be removed by etching.

Referring to FIG. 9B, the 3C—SiC layer 303 is formed on the surface of the carbonized layer 302 by, for example, plasma CVD. The 3C—SiC layer 303 is formed at a temperature of, preferably, equal to or lower 1000° C. and more preferably equal to or lower than 900° C. Forming the 3C—SiC layer 303 at a temperature equal to or lower than 900° C. reduces stress resulting from the difference in thermal expansion coefficient between the Si (111) substrate 101 and the 3C—SiC layer 303, thereby reducing the chance of defects occurring.

Figure 10A:
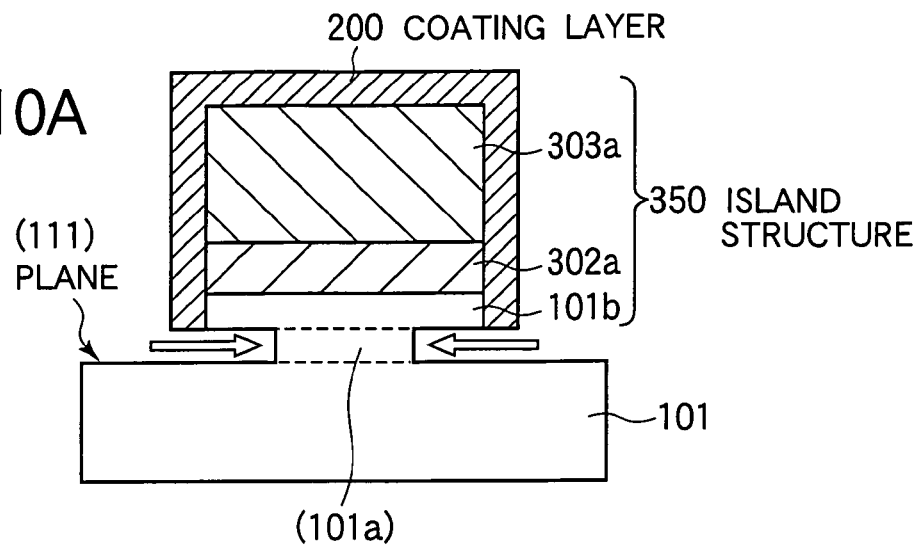
FIG. 10A-10C illustrate an etching process, a releasing process, and a bonding process of the second embodiment.
Figure 10B:
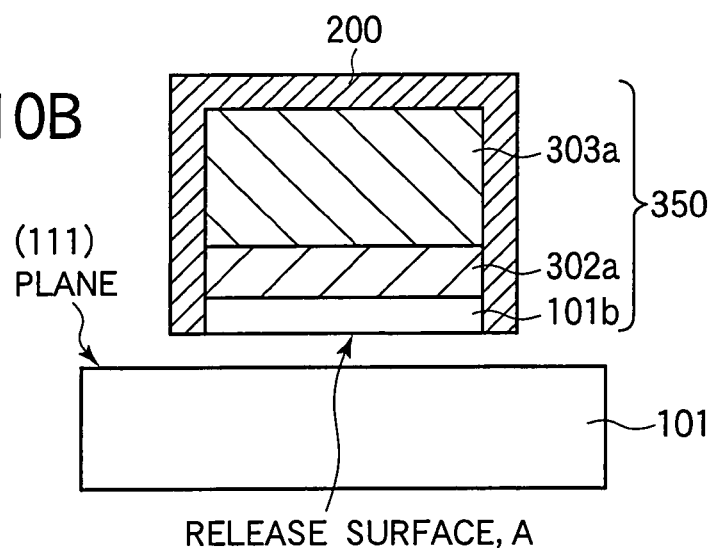
Figure 10C:
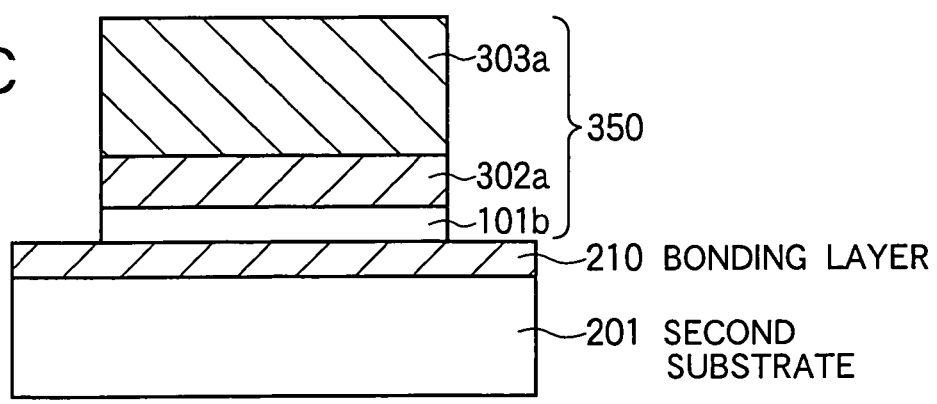

FIG. 10A-10C illustrate an etching process, a releasing process, and a bonding process of the second embodiment. Etching, releasing, and bonding processes will be described with reference to FIGS. 10A-10C. Referring to FIGS. 10A and 10B, an island structure 350 is formed on the surface of the Si (111) substrate 101, and is coated with a coating layer 200. The island structure 350 includes a 3C—SiC layer 303a, a carbonized layer 302a, and a portion 101b of an Si (111) substrate 101. The portion 101b has a predetermined thickness. The coating layer 200 serves as a mask when the Si (111) substrate 101 is etched in a direction parallel to the (111) plane of the Si (111) substrate 101. The processes are the same as those in the first embodiment, and their detailed description is omitted. The portion 101b is a part of the Si (111) substrate, and has a release surface "A" when the island structure 350 has been released from the Si (111) substrate just as in the first embodiment.

FIG. 10C illustrates the bonding process in which the released island structure 350 is bonded to the second substrate 201 with the release surface "A" in direct contact with the surface of the second substrate 201. The bonding process is the same as that in the first embodiment, and its detailed description is omitted.

The SiC layer 303a preferably has a predetermined device structure or a part of a predetermined device structure. An SiC device is formed at high temperature and therefore it is preferable that any process should not be performed at a temperature in the vicinity of 1000° C. after the island structure 350 has been bonded by intermolecular force to the second substrate 201. Elements in the SiC layer 303a are, for example, MOSFETs, shotty diodes (SBD), and static induction transistors (SIT).

As described above, the 3C—SiC layer and the Si (111) layer are released from the Si (111) substrate and a low-resistance contact is formed of an Si (111) layer. This structure provides the following advantages.
(1) A 3C—SiC device can be formed which includes a substrate having a higher heat conductivity than Si.
(2) The 3C—SiC devices are interconnected using thin film wirings to implement a highly integrated circuit on the second substrate.

Modification

FIGS. 11A-11B and FIGS. 12A-12B illustrate a modification to the second embodiment.

Figure 11A:
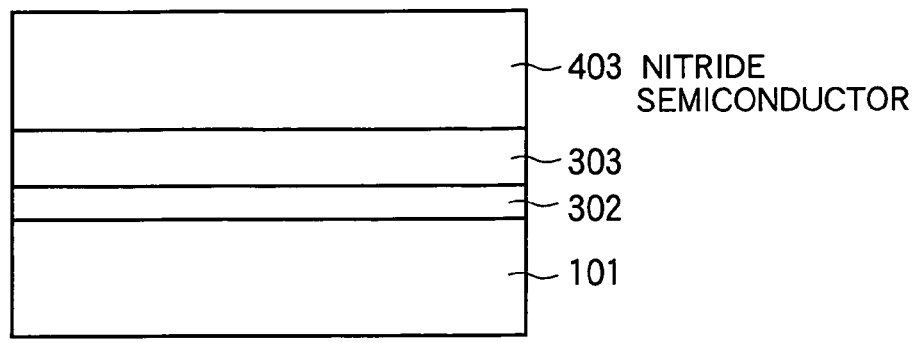
FIGS. 11A-11B illustrate a modification to the second embodiment.

Referring to FIG. 11A, a nitride semiconductor layer 403 is formed on the surface of the 3C—SiC layer 303. The aforementioned releasing process of the second embodiment is performed to release an island structure 450 including the portion 101b of the Si (111) substrate. Then, as shown in FIG. 11B, the bonding process of the second embodiment is performed to bond the island structure 450 (only one of the islands 450 is shown in the drawing) to a bonding layer 210 formed on the second substrate 201.

Figure 11B:
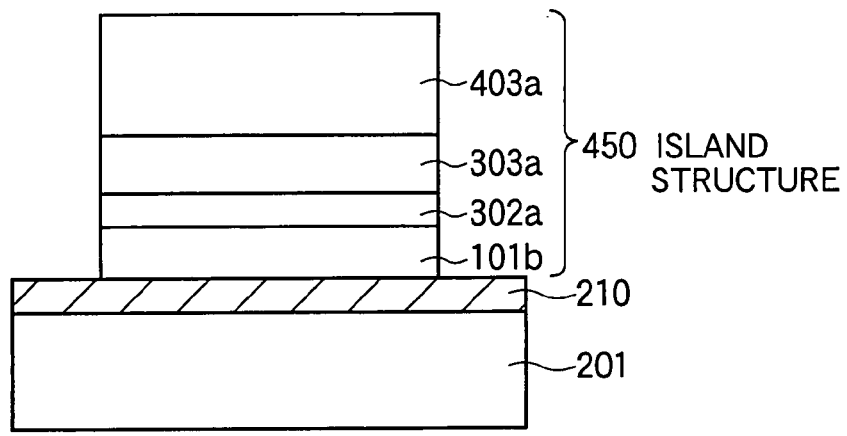
Figure 12A:
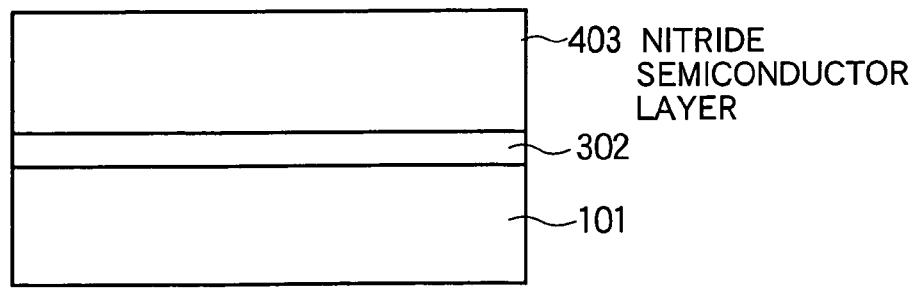
FIGS. 12A and 12B illustrate a modification to that shown in FIGS. 11A and 11B.
Figure 12B:
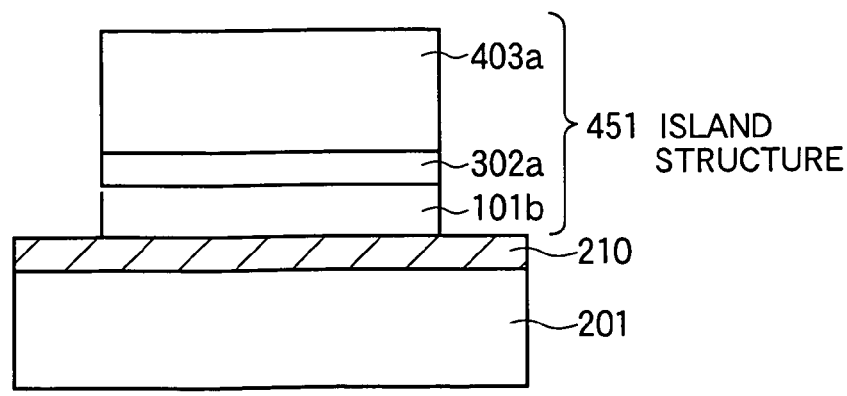

FIGS. 12A and 12B illustrate a modification to that shown in FIGS. 11A and 11B. The process in which the SiC layer 303 is formed may be omitted and the nitride semiconductor layer 403 may be formed directly on the carbonized layer 302 (FIG. 12A). Then, the structure shown in FIG. 12A is bonded as an island structure 451 to the bonding layer 210 formed on the second substrate 201.

The invention being thus described, it will be obvious that the same may be varied in many ways. Such variations are not to be regarded as a departure from the scope of the invention, and all such modifications as would be obvious to one skilled in the art intended to be included within the scope of the following claims.

What is claimed is:

1. A method for manufacturing a semiconductor thin film device, comprising:
    preparing a first substrate in the form of a Si (111) substrate including at least a first portion and a second portion located on the first portion;
    forming a buffer layer on a surface of the second portion;
    forming a single crystal semiconductor layer on the buffer layer;
    patterning the single crystal semiconductor layer, the buffer layer, the first portion, and the second portion to form an island that sits on the first portion and includes the single crystal semiconductor layer, the buffer layer, and the second portion;
    forming a coating layer that covers an exposed surface of the island;
    etching the first portion along a Si (111) plane of the Si (111) substrate to release the island from another portion of the first substrate, the coating layer serving as a mask during the etching; and
    bonding the released island to a second substrate different from the first substrate, by means of intermolecular force, with a released Si surface of the released island in direct contact with the second substrate.

2. The method according to claim 1, wherein the Si (111) substrate has a volume resistivity equal to or lower than $0.01\Omega\text{cm}$, and the second substrate has a metal layer formed on a surface thereof, the metal containing at least one or more elements selected from the group consisting of Ni, Cr, Ti, Pd, Al, and Cu;
    wherein bonding the released island is performed so that the released island is bonded to the second substrate with the second portion of the released island in direct contact with the metal layer.

3. The method according to claim 1, wherein the buffer layer is formed of $Al_xGa_{1-x}N$ ($1 \geq x \geq 0$), and the single crystal semiconductor layer includes one of
    (i) a single layer structure formed of a material selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$), and
    (ii) a multilayer structure formed of materials selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$).

4. The method according to claim 1, wherein the buffer layer contains Si and C, and the single crystal semiconductor layer is formed of a cubic crystal SiC layer.

5. The method according to claim 1, wherein the single crystal semiconductor layer further contains one of
    (i) a cubic crystal SiC layer and a single layer structure formed of a material selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$), and
    (ii) a cubic crystal SiC layer and a multilayer structure formed of materials selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$).

6. The method according to claim 1, wherein the buffer layer contains Si and C, the single crystal semiconductor layer contains either a single layer structure formed of a material selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$) or a multilayer structure formed of materials selected from the group consisting of $Al_xGa_{1-x}N$ ($1 \geq x \geq 0$), $In_xGa_{1-x}N$ ($1 \geq x \geq 0$), and $Al_xIn_{1-x}N$ ($1 \geq x \geq 0$).

7. The method according to claim 1, wherein the released Si surface of the second portion bonded to the second substrate has a peak-to-valley roughness $R_{PV}$ equal to or smaller than 1.6 nm.

8. The method according to claim 1, wherein the etching is performed such that an etching speed is higher in a direction parallel to the Si (111) plane than in a direction perpendicular to the Si (111) plane.

9. The method according to claim 1, wherein the etching is performed using an etchant selected from the group consisting of KOH, tetra-methyl-ammonium-hydroxide (TMAH), and ethylene diamine pyrocatechol (EDP).

* * * * *